Figure 1:
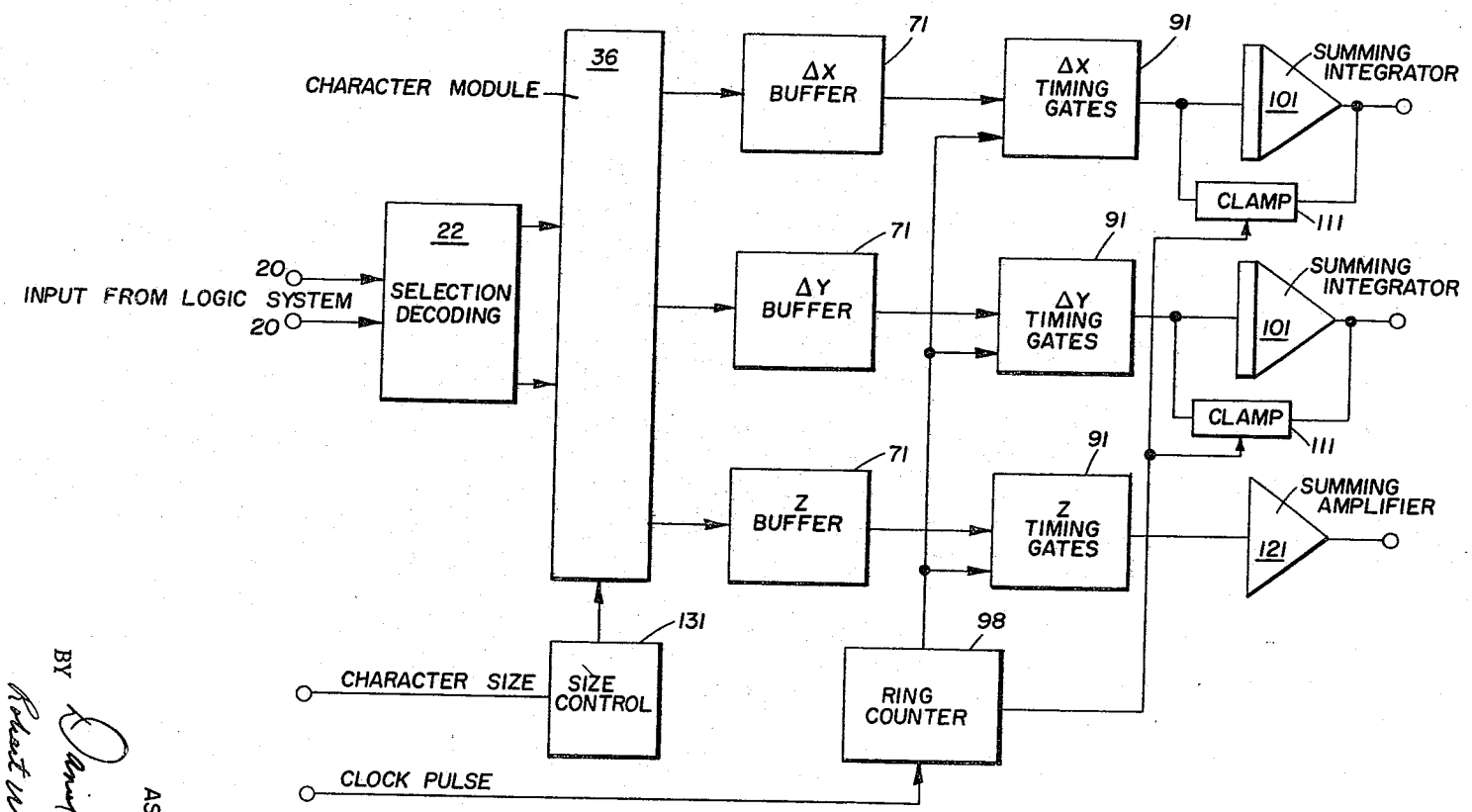
Figure 4:
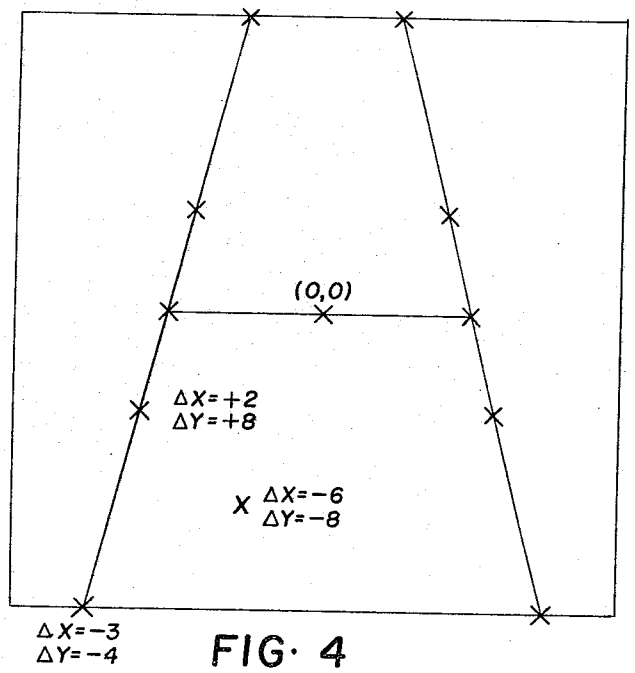
Figure 2:
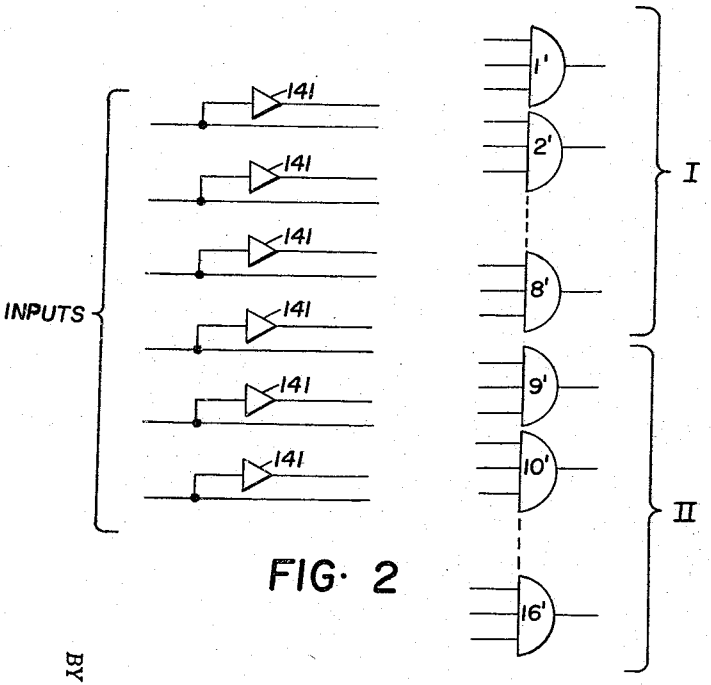
Figure 3:
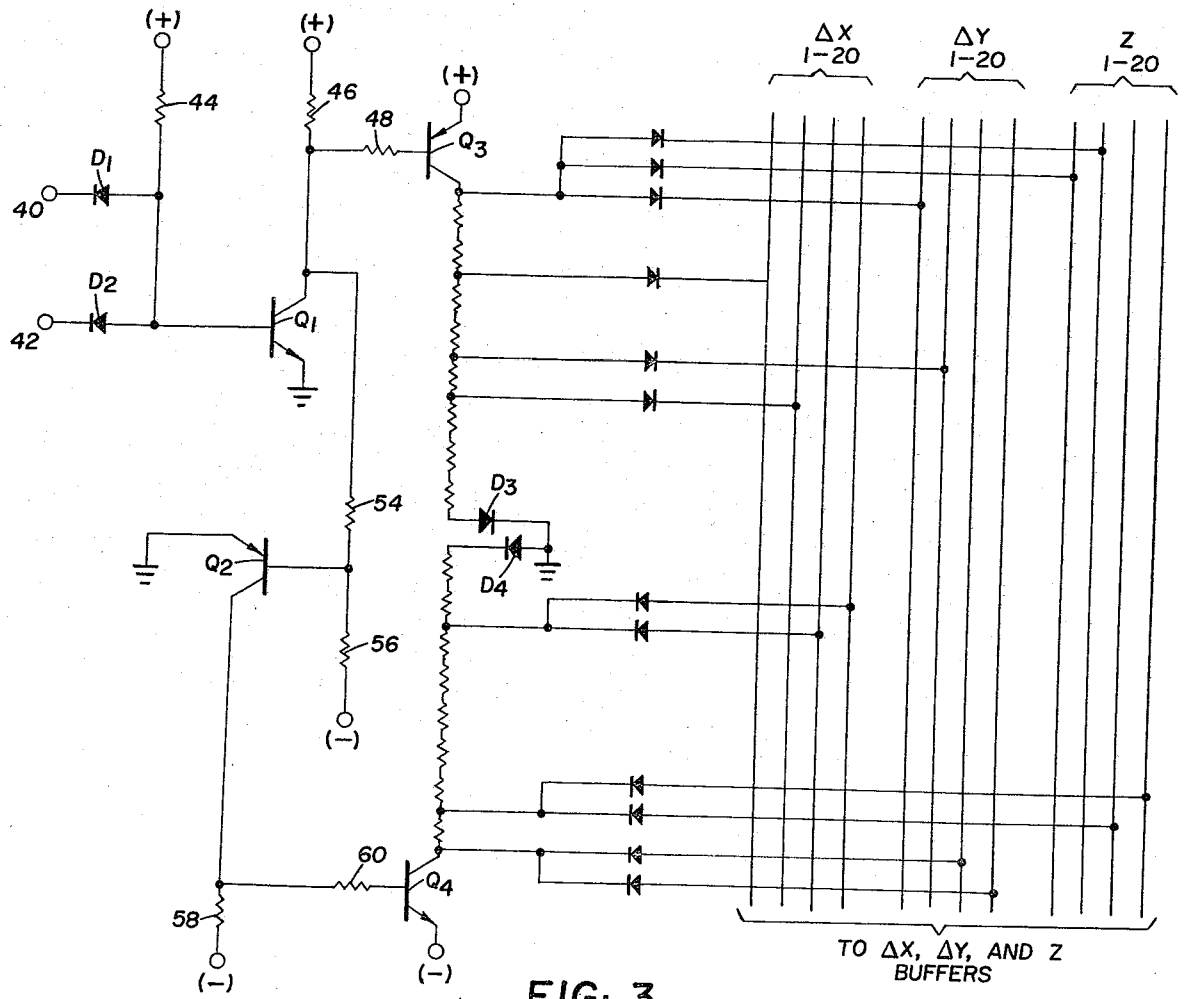
Figure 6:
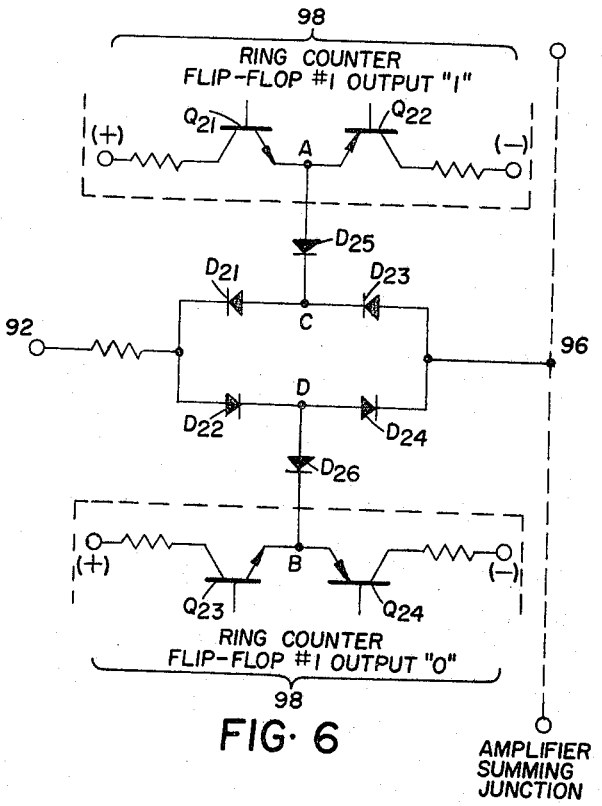
Figure 5:
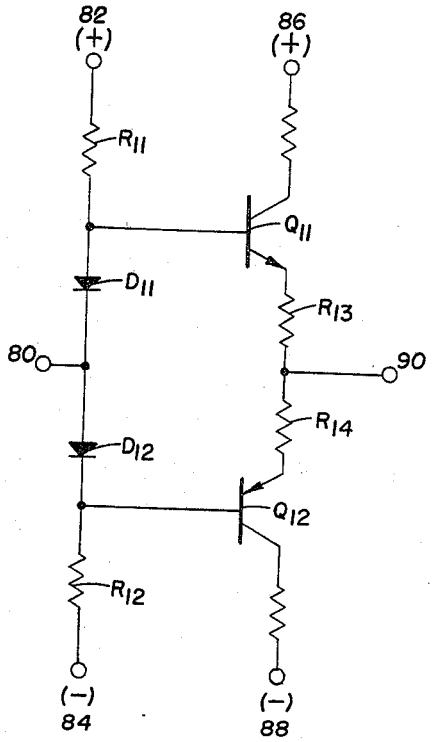
Figure 7:
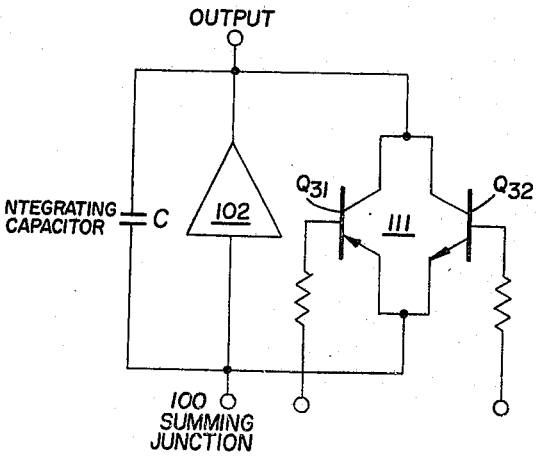
Figure 8:
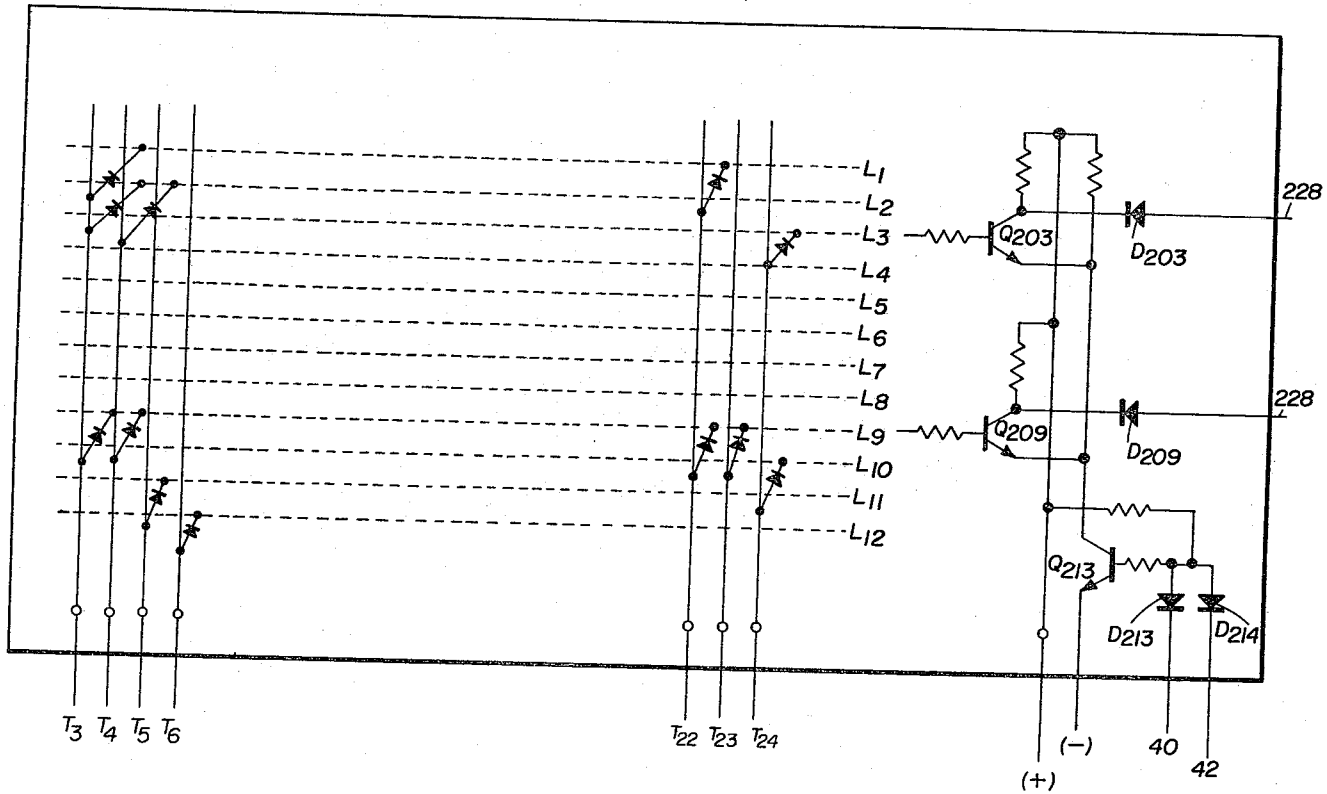
Figure 9:
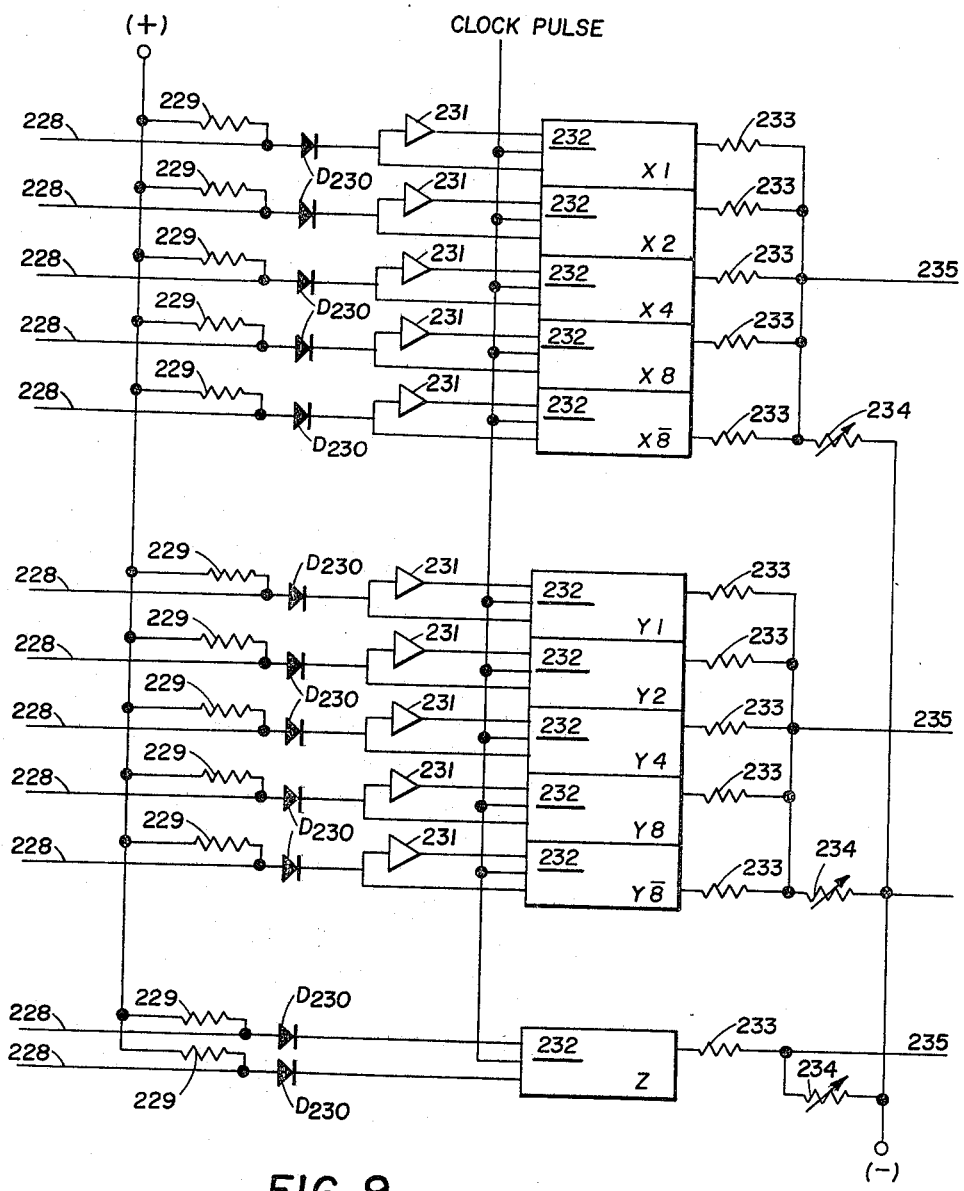

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED DECEMBER 16, 1969

869 O.G. 711

T869,002
CHARACTER GENERATOR

Asger T. Nielsen, San Diego, Calif., assignor to Eastman Kodak Company, Rochester, N.Y., a corporation of New Jersey

Filed Sept. 7, 1967, Ser. No. 666,131
**Int. Cl. H03k *3/02***
U.S. Cl. 328—187
6 Sheets Drawing. 15 Pages Specification

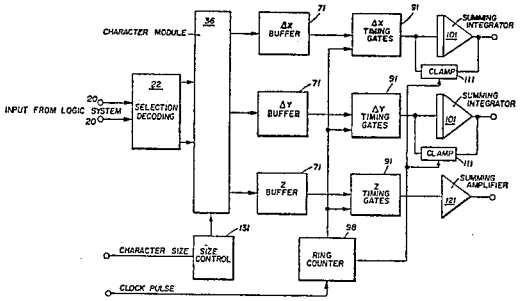

A character generator draws characters upon the face of a cathode ray tube by drawing straight line strokes. Each character has its own circuit board so that characters may be changed merely by changing individual circuit boards. In one embodiment each character board generates all of the needed voltages using a voltage divider and applies these voltages to the outputs where each output represents a stroke. In another embodiment, each component, either horizontal or vertical, consists of one of five values or combinations thereof. Each character circuit board connects the proper number of lines to represent the correct length of the component.

Also disclosed is a novel switching circuit consisting entirely of diodes wherein the bias for a diode is derived from the voltage drop across another diode.

Also disclosed is a novel buffer amplifier whose biases are derived using diodes.

Dec. 16, 1969 A. T. NIELSEN T869,002

CHARACTER GENERATOR

Filed Sept. 7, 1967 6 Sheets-Sheet 1

ASGER T. NIELSEN
INVENTOR.

BY Daniel E. Gragow
Robert W Hampton

ATTORNEYS

ASGER T. NIELSEN
INVENTOR.
BY Daniel E. Gragon
Robert W Hampton
ATTORNEYS

CHARACTER GENERATOR

Filed Sept. 7, 1967

6 Sheets-Sheet 3

ASGER T. NIELSEN
INVENTOR.

BY Daniel E. Gregory
Robert W. Haington

ATTORNEYS

ASGER T. NIELSEN
INVENTOR.

BY Daniel E. Gragoe
Robert W. Hampton

ATTORNEYS

ASGER T. NIELSEN
INVENTOR.

BY David E. Dragous
Robert W. Hampton

ATTORNEYS

CHARACTER GENERATOR

Filed Sept. 7, 1967

6 Sheets-Sheet 6

ASGER T. NIELSEN
INVENTOR.
BY Daniel E. Sragow
Robert W. Hampton
ATTORNEYS